(12) United States Patent
Sonderman et al.

(10) Patent No.: US 8,017,411 B2
(45) Date of Patent: Sep. 13, 2011

(54) DYNAMIC ADAPTIVE SAMPLING RATE FOR MODEL PREDICTION

(75) Inventors: Thomas J. Sonderman, Austin, TX (US); Alexander J. Pasadyn, Austin, TX (US); Gregory A. Cherry, Austin, TX (US)

(73) Assignee: GlobalFoundries, Inc., Grand Cayman (KY)

( * ) Notice: Subject to any disclaimer, the term of this patent is extended or adjusted under 35 U.S.C. 154(b) by 633 days.

(21) Appl. No.: 10/323,530

(22) Filed: Dec. 18, 2002

(65) Prior Publication Data

US 2004/0121495 A1    Jun. 24, 2004

(51) Int. Cl.
 *H01L 21/00* (2006.01)
(52) U.S. Cl. .......................................... 438/14; 438/17
(58) Field of Classification Search ............... 438/5–8, 438/10, 14, 17, 689, 16, 18, 7, 89; 700/28–32, 700/108, 51, 121, 116, 115; 702/81–84; 257/48, 368
See application file for complete search history.

(56) References Cited

U.S. PATENT DOCUMENTS

| | | | | |
|---|---|---|---|---|
| 4,635,182 A | * | 1/1987 | Hintz | 700/9 |
| 5,519,605 A | * | 5/1996 | Cawlfield | 700/31 |
| 5,711,843 A | * | 1/1998 | Jahns | 156/345.24 |
| 5,819,006 A | * | 10/1998 | Keeler et al. | 706/25 |
| 5,895,596 A | * | 4/1999 | Stoddard et al. | 219/497 |
| 5,896,294 A | * | 4/1999 | Chow et al. | 700/121 |
| 6,002,989 A | | 12/1999 | Shiba et al. | 702/84 |
| 6,278,898 B1 | * | 8/2001 | Shah | 700/29 |
| 6,442,496 B1 | * | 8/2002 | Pasadyn et al. | 702/83 |
| 6,477,432 B1 | * | 11/2002 | Chen et al. | 700/51 |
| 6,766,214 B1 | * | 7/2004 | Wang et al. | 700/121 |
| 6,988,017 B2 | * | 1/2006 | Pasadyn et al. | 700/121 |
| 2002/0080355 A1 | * | 6/2002 | Maris | 356/432 |
| 2002/0193899 A1 | * | 12/2002 | Shanmugasundram et al. | 700/108 |
| 2004/0044431 A1 | * | 3/2004 | Pellegrini et al. | 700/121 |

FOREIGN PATENT DOCUMENTS

| EP | 201296 A | * | 11/1986 |
|---|---|---|---|
| WO | 02/103778 | | 12/2002 |

OTHER PUBLICATIONS

International Search Report dated Jun. 24, 2004 for International application No. PCT/US03/35327 Filed Nov. 6, 2003.
English Translation of German Official Communication dated Jan. 29, 2010; 3 pgs.

* cited by examiner

*Primary Examiner* — Kiesha Bryant
*Assistant Examiner* — Igwe U Anya
(74) *Attorney, Agent, or Firm* — Williams, Morgan & Amerson, P.C.

(57) ABSTRACT

A method and an apparatus for dynamically adjusting a sampling rate relating to wafer examination. A process step is performed upon a plurality of workpieces associated with a lot. A sample rate for acquiring metrology data relating to at least one of the processed workpiece is determined. A dynamic sampling rate adjustment process is performed to adaptively modify the sample rate. The dynamic sampling rate adjustment process includes comparing a predicted process outcome and an actual process outcome and modifying the sampling rate based upon the comparison.

24 Claims, 9 Drawing Sheets

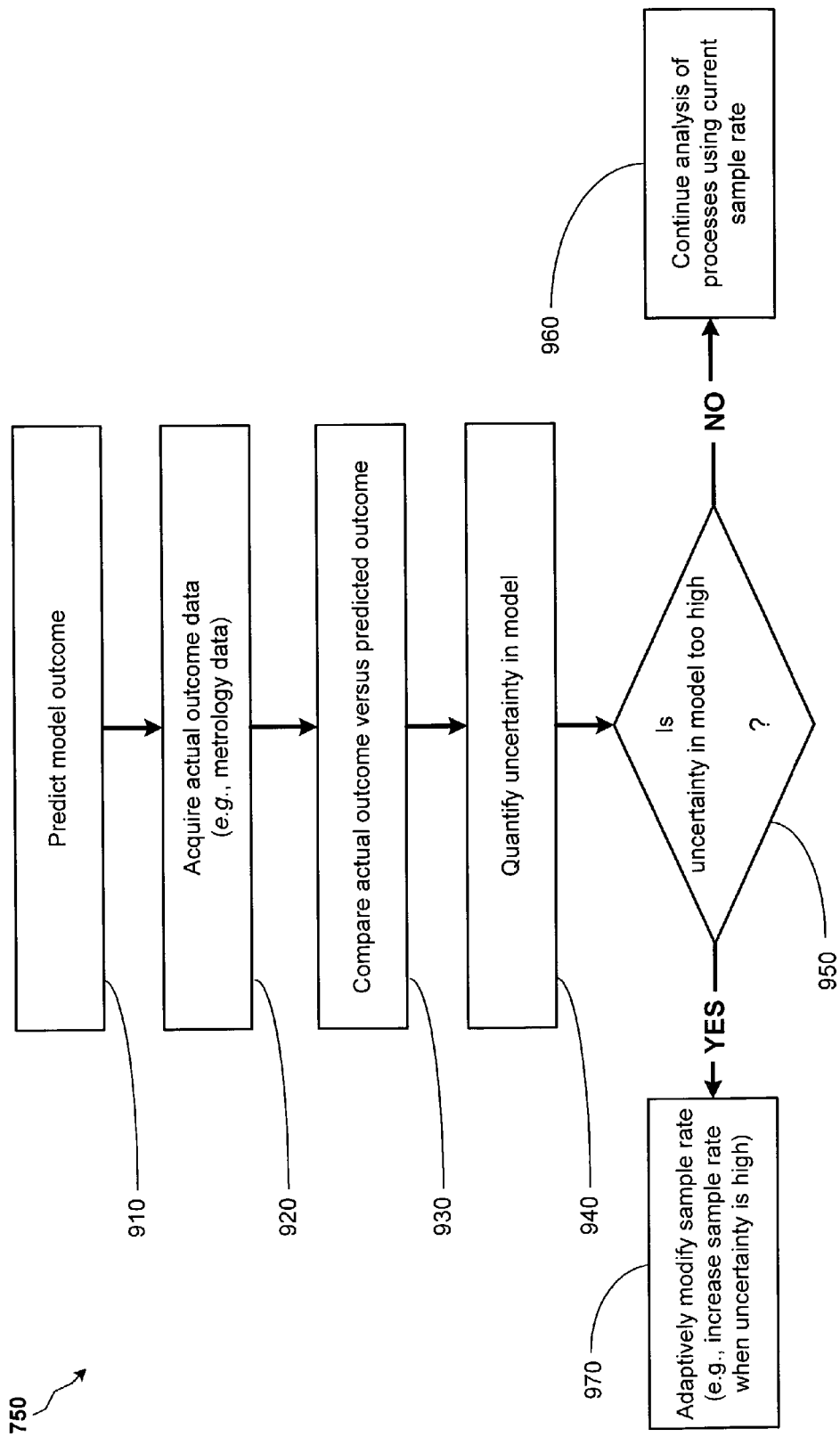

DYNAMIC ADAPTIVE SAMPLING RATE FOR MODEL PREDICTION

BACKGROUND OF THE INVENTION

1. Field of the Invention

This invention relates generally to semiconductor manufacturing, and, more particularly, to a method and apparatus for dynamically adjusting a sampling rate relating to wafer examination for performing a model prediction.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a block diagram depiction of a prior art process flow is illustrated. A manufacturing system may determine a sample rate for performing wafer analysis based upon a particular process to be performed on semiconductor wafers 105 (block 210). The manufacturing system may then process the semiconductor wafers 105 (block 220). Upon processing the semiconductor wafers 105 in a batch, the manufacturing system may acquire metrology data based upon the sampling rate (block 230). The sampling rate is used to determine how many and which semiconductor wafers 105 are examined for metrology data acquisition in a lot. Upon an acquisition of metrology data, the system may perform corrections to the processing based upon metrology data analysis (block 240). Upon determining the one or more corrections to be made on the semiconductor wafers 105, the manufacturing system continues processing of the semiconductor wafers 105 (block 250).

Among the problems associated with the current methodology is the fact that data from the sampled semiconductor wafers 105 may not provide an accurate assessment of the state of the metrology data. For example, some processes or a change in a condition in the manufacturing system may call for additional metrology data for performing a more accurate assessment of the state of the metrology data. The predetermined sampling rate may not be adequate to acquire sufficient data to make an accurate assessment of the condition of the processed semiconductor wafers 105. For example, changing conditions, such as changes in the operation of the processing tool and the like, may cause the predetermined sampling rate to be inadequate.

Furthermore, a process model used to perform processes on semiconductor wafers 105 may be modified during the processing phase, such that more data or less data may be required for proper assessment of the processing accuracy. Inadequate metrology data may cause errors in the processing of semiconductor wafers 105. Additionally, insufficient metrology data may result in a lack of process corrections that otherwise may have been made if proper metrology data were available. Conversely, excessive acquisition of metrology data may cause inefficiencies during wafer processing.

The present invention is directed to overcoming, or at least reducing, the effects of, one or more of the problems set forth above.

SUMMARY OF THE INVENTION

In one aspect of the present invention, a method is provided for dynamically adjusting a sampling rate relating to wafer examination. A process step is performed upon a plurality of workpieces associated with a lot. A sample rate for acquiring metrology data relating to at least one of the processed workpiece is determined. A dynamic sampling rate adjustment process is performed to adaptively modify the sample rate. The dynamic sampling rate adjustment process includes comparing a predicted process outcome and an actual process outcome and modifying the sampling rate based upon the comparison.

In another aspect of the present invention, a method is provided for dynamically adjusting a sampling rate relating to wafer examination. A process step is performed upon a plurality of workpieces associated with a lot. A sample rate for acquiring metrology data relating to at least one of the processed workpiece is determined. An outcome from the process performed on the workpieces is predicted. Actual outcome data relating to the process performed on the workpieces based upon the sample rate is acquired. The predicted outcome is compared with the actual outcome. An uncertainty relating to a process outcome prediction performed by the model is determined. The sample rate is modified based upon a determination that the uncertainty is above a predetermined range of tolerance.

In another aspect of the present invention, a system is provided for dynamically adjusting a sampling rate relating to wafer examination. The system includes a processing tool to process a plurality of workpieces. The system also includes a metrology tool to acquire metrology data relating to the processed workpieces. The system also includes a process controller operatively coupled to the processing tool. The process controller is capable of performing a dynamic sampling rate adjustment process to adaptively modify the sample rate. The dynamic sampling rate adjustment process includes comparing a predicted process outcome and an actual process outcome and modifying the sampling rate based upon the comparison.

In another aspect of the present invention, an apparatus is provided for dynamically adjusting a sampling rate relating to wafer examination. The apparatus includes a process controller adapted to control a process performed by a processing tool upon a plurality of workpieces. The process controller is capable of performing a dynamic sampling rate adjustment process to adaptively modify a sample rate used to acquire metrology data relating to the processed workpieces. The dynamic sampling rate adjustment process includes comparing a predicted process outcome and an actual process outcome and modifying the sampling rate based upon the comparison.

In yet another aspect of the present invention, a computer readable program storage device encoded with instructions is provided for dynamically adjusting a sampling rate relating to wafer examination. The computer readable program storage device encoded with instructions that, when executed by the computer, performs a method, which comprises: performing a process step upon a plurality of workpieces associated with a lot; determining a sample rate for acquiring metrology data relating to at least one of the processed workpiece; and performing a dynamic sampling rate adjustment process to adaptively modify the sample rate. The dynamic sampling rate adjustment process includes comparing a predicted process outcome and an actual process outcome and modifying the sampling rate based upon the comparison.

BRIEF DESCRIPTION OF THE DRAWINGS

The invention may be understood by reference to the following description taken in conjunction with the accompanying drawings, in which like reference numerals identify like elements, and in which:

FIG. 9 illustrates a more detailed flowchart depiction of a method of performing a dynamic adaptive sampling rate adjustment process, as indicated in FIG. 7, in accordance with one illustrative embodiment of the present invention.

Figure 1:
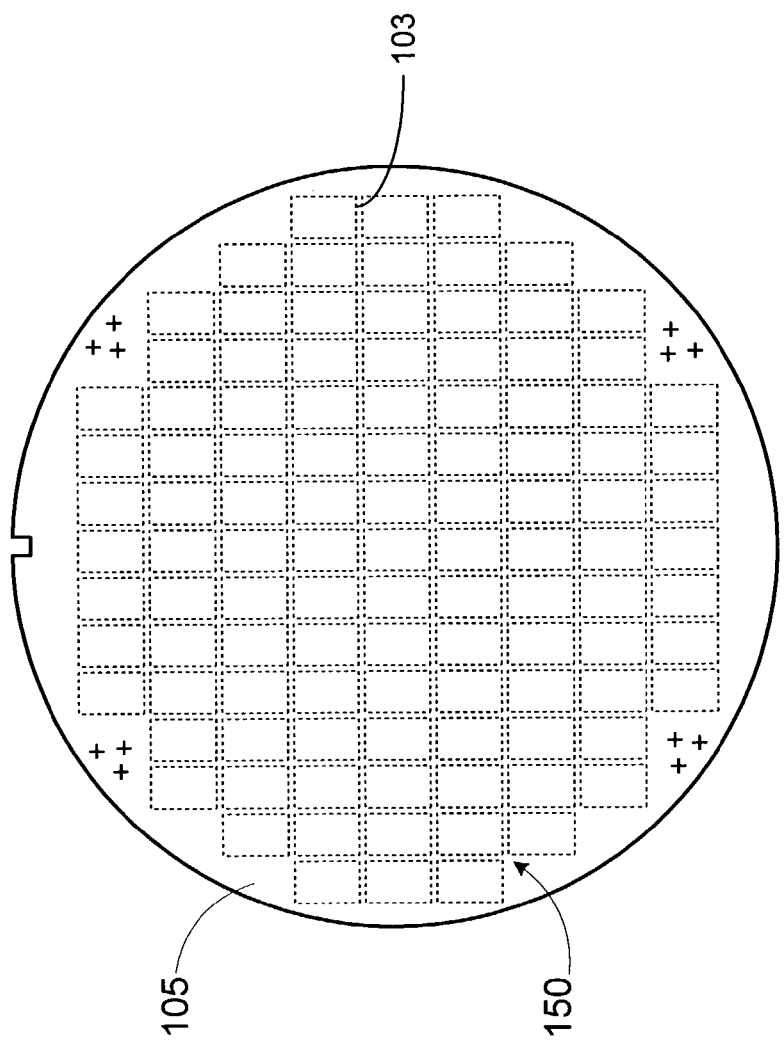
FIG. 1 is a simplified diagram of a prior art semiconductor wafer being processed.
Figure 2:
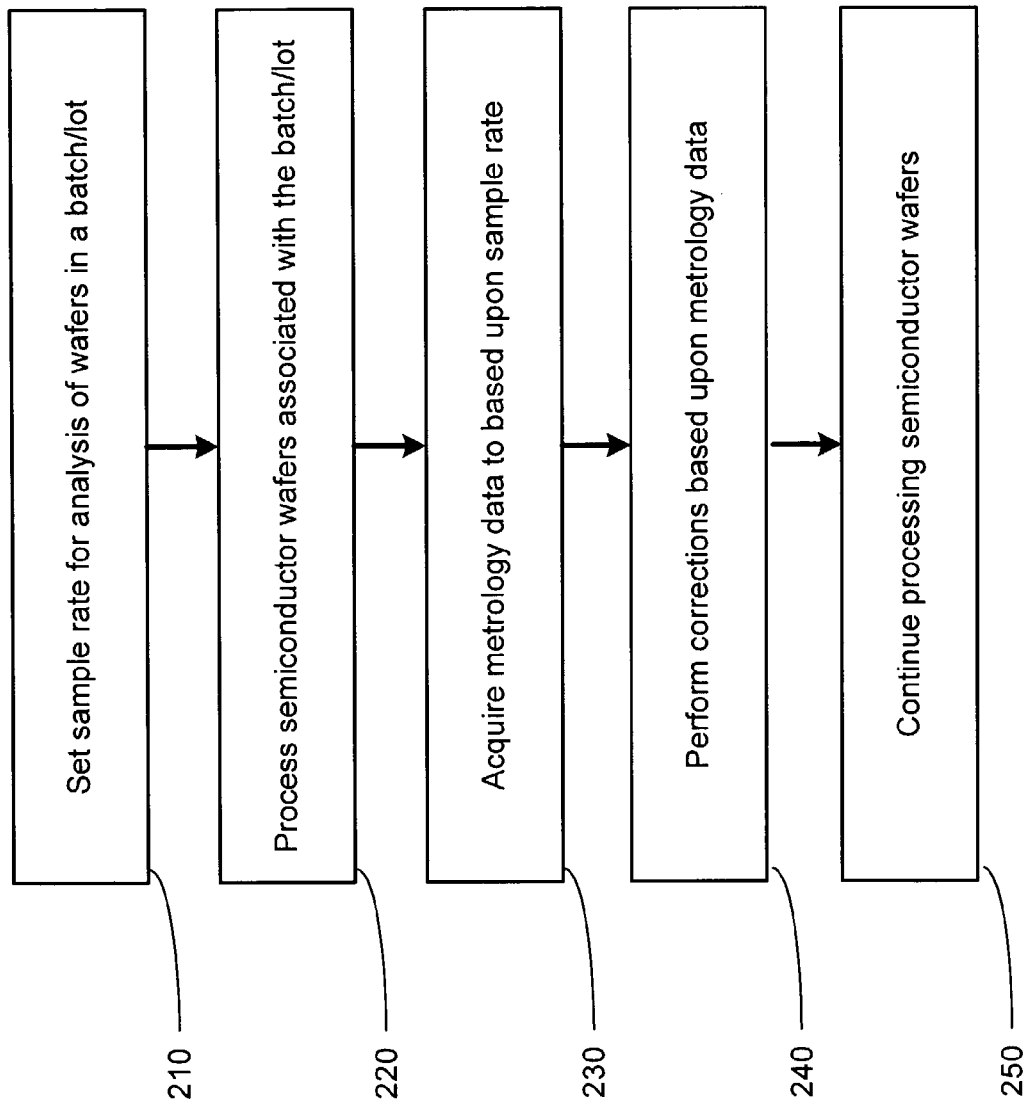
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for performing a dynamic adaptive sampling rate, which may be used to adjust the sampling of wafers 105 for analysis. Adjusting the sampling rates may be performed in response to changing conditions during processing of semiconductor wafers 105. For example, the process allows dynamic changes in the sampling rate used to examine the semiconductor wafers 105 based upon various factors potentially affecting the proper manufacture of the semiconductor wafers 105. A process model that performs a prediction of process results, e.g., how the semiconductor wafers 105 will look after a set amount of processing is performed, may be modified such that the process model becomes more sensitive to metrology data. Therefore, an increase in the sampling rate may be implemented to more accurately predict process results and match the increased sensitivity of the process model. In other words, the higher the sensitivity of a process model to metrology data, the higher the sampling rate and vice versa. In one embodiment, the modified sampling rate may be implemented in a subsequent batch of semiconductor wafers 105. Utilizing the adaptive sampling rate provided by embodiments of the present invention, a more accurate assessment of the metrology state of the processed semiconductor wafers 105 may be possible, thereby, providing for better and more accurate process control.

Figure 3:
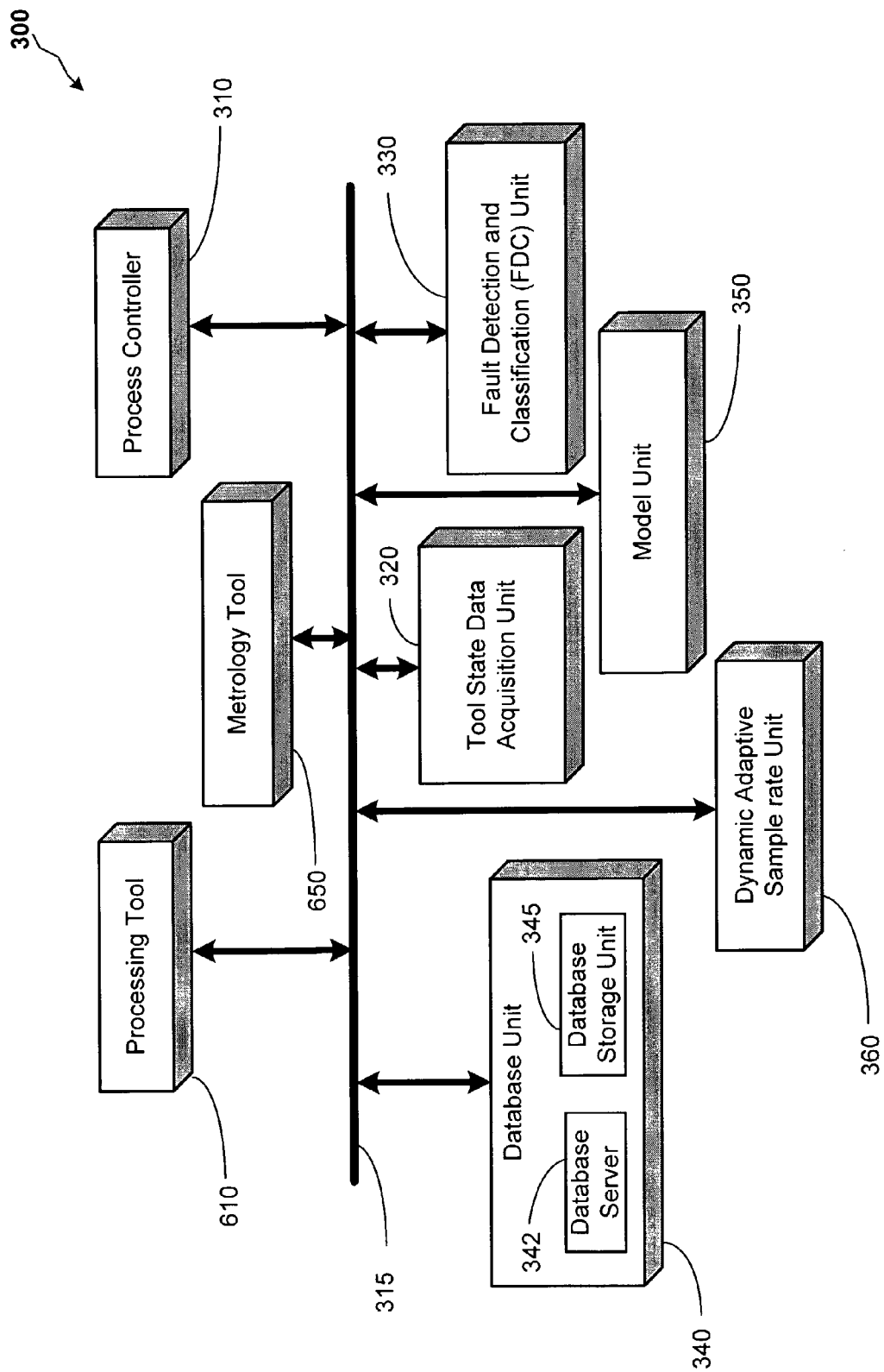
FIG. 3 provides a block diagram representation of a system in accordance with one illustrative embodiment of the present invention.

Turning now to FIG. 3, a block diagram depiction of a system 300 in accordance with embodiments of the present invention is illustrated. A process controller 310 in the system 300 is capable of controlling various operations relating to a processing tool 610. The system 300 is capable of acquiring manufacturing related data, such as metrology data related to processed semiconductor wafers 105, tool state data, and the like. The system 300 may also comprise a metrology tool 650 to acquire metrology data related to the processed semiconductor wafers 105.

The system 300 may also comprise a database unit 340. The database unit 340 is provided for storing a plurality of types of data, such as metrology data, data related to the operation of the system 300 (e.g., the status of the processing tool 610, the status of semiconductor wafers 105, etc.), and the like. The database unit 340 may store tool state data relating to a plurality of process runs performed by the processing tool 610. The database unit 340 may comprise a database server 342 for storing tool state data and/or other manufacturing data related to processing semiconductor wafers 105 into a database storage unit 345.

The system 300 may also comprise a tool state data acquisition unit 320 for acquiring tool state data. The tool state data may include pressure data, temperature data, humidity data, gas flow data, various electrical data, and the like, related to operations of the processing tool 610. Exemplary tool state data for an etch tool may include gas flow, chamber pressure, chamber temperature, voltage, reflected power, backside helium pressure, RF tuning parameters, etc. Tool state data may also include data external to the processing tool 610, such as ambient temperature, humidity, pressure, etc. A more detailed illustration and description of the tool state data acquisition unit 320 is provided in FIG. 4 and accompanying description below.

The system 300 also comprises a fault detection and classification unit (FDC) 330 capable of performing various fault detection analyses relating to the processing of semiconductor wafers 105. The fault detection and classification unit 330 is capable of providing data relating to faults during processing of semiconductor wafer 105. Fault detection analysis performed by the fault detection and classification unit 330 may include analysis of tool state data and/or metrology data. The FDC unit 330 may correlate particular tool state data to errors detected on the processed semiconductor wafer 105 by analyzing the metrology tool data. For example, particular errors, such as critical dimension errors discovered on the processed semiconductor wafers 105 may be correlated to particular gas flow rates or temperature data relating to tool state data. The fault detection performed by the FDC unit 330 may also include analyzing data from in situ sensors integrated into the processing tools 610.

A model unit 350 in the system 300 is capable of performing a prediction of wafer state outcome (e.g., a prediction relating to one or more condition of the processed semiconductor wafers 105, such as prediction of critical dimensions of certain structures formed on the semiconductor wafers 105. A prediction of wafer state outcome may be based upon process condition input data. The model unit 350 is capable of modeling the behavior and/or results of process steps to be performed on the semiconductor wafers 105 in order to determine the possible condition of the processed semiconductor wafers 105 based upon certain specified control input parameters.

Prediction data from the model unit 350 may be used by a dynamic adaptive sample rate unit 360 associated with the system 300 to perform a dynamic adaptation of the sampling rate. The dynamic adaptive sample rate unit 360 is capable of dynamically modifying the sampling rate (relating to examining certain wafer 105 in batch/lot) based upon one of a plurality of process changes that may occur during processing of semiconductor wafers 105. The dynamic adaptive sample rate unit 360 may increase the sampling rate of the examination of semiconductor wafers 105 in a batch based upon a change in the model unit 350. In other words, if the model unit 350 becomes more sensitive to metrology data, an increase in the sampling rate may be implemented such that more accurate metrology data is provided to the model unit 350 for better prediction of process output. Additionally, based upon certain predictions provided by the model unit 350, the system 300 may change the sampling rate to more closely assess the outcome of process steps performed on the semiconductor wafers 105. A more detailed description of the dynamic adaptive sample rate unit 360 is provided in FIG. 5 and accompanying description below.

In one embodiment, the system 300 may implement a supervisory role in modifying sampling rate from one batch to another, based upon the uncertainty factors provided by embodiments of the present invention. In one embodiment, end-of-line electrical tests, such as ring oscillation frequency measurements, drive currents, and the like, are performed. Results from the actual electrical measurements are then compared to predicted electrical parameters provided by the model unit 350. An uncertainty factor is then determined between based upon the differences between the actual electrical test results and the predicted electrical parameters. If the uncertainty factor is relatively high, then the sampling rate may not be high enough to adequately characterize the wafer state of the batch/lot. Therefore, the sampling rate may be increased for a subsequent batch/lot. The uncertainty factor may be used by the sample rate unit 360 to modify the sample rate used to examine processed wafers 105 for metrology analysis. In one embodiment, the sample rate is modified for examining processed wafers 105 in a subsequently processed batch.

The process controller 310, the FDC unit 330, the model unit 350, and/or the dynamic adaptive sample rate unit 360 may be software, hardware, or firmware units that are standalone units or may be integrated into a computer system associated with the system 300. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Figure 4:
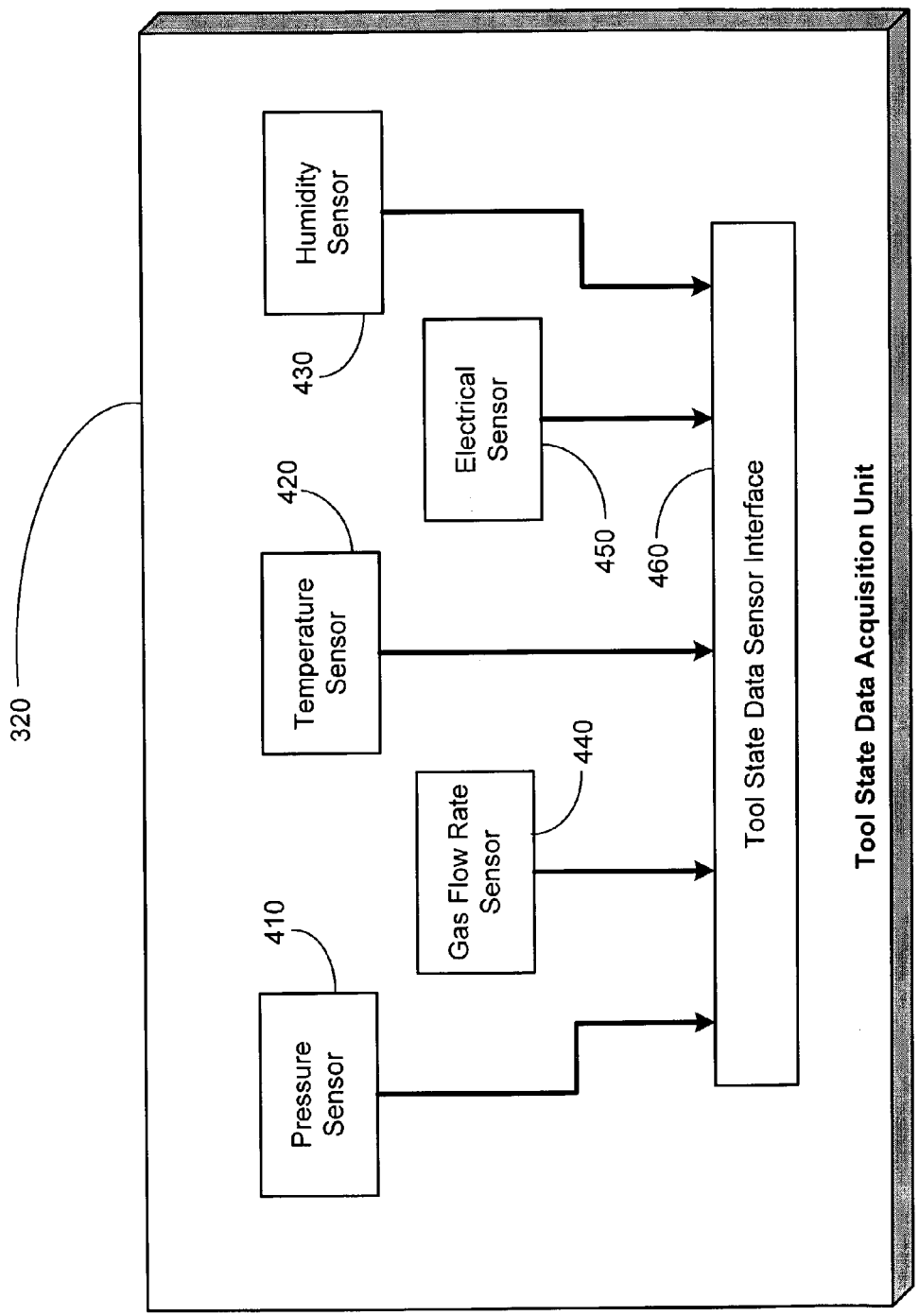
FIG. 4 illustrates a more detailed block diagram representation of a tool state data acquisition unit of FIG. 3, in accordance with one illustrative embodiment of the present invention.

Turning now to FIG. 4, a more detailed block diagram of the tool state data acquisition unit 320 illustrated in FIG. 3 is provided. The tool state data acquisition unit 320 may comprise any of a variety of different types of sensors, e.g., a pressure sensor 410, a temperature sensor 420, a humidity sensor 430, a gas flow rate sensor 440, an electrical sensor 450, etc. In an alternative embodiment, the tool state data acquisition unit 320 may comprise in situ sensors that are integrated into the processing tool 610. The pressure sensor 410 is capable of detecting the pressure within the processing tool 610. The temperature sensor 420 is capable of sensing the temperature of various portions of the processing tool 610. The humidity sensor 430 is capable of detecting the relative humidity at various portions in the processing tool 610, or of the surrounding ambient conditions. The gas flow rate sensor 440 may comprise a plurality of flow-rate sensors that are capable of detecting the flow-rate of a plurality of process gases utilized during processing of semiconductor wafers 105. For example, the gas flow rate sensor 440 may comprise sensors that can detect the flow rate of gases such as $NH_3$, $SiH_4$, $N_2$, $N_2O$, and/or other process gases.

In one embodiment, the electrical sensor 450 is capable of detecting a plurality of electrical parameters, such as the current provided to a lamp used in a photolithography process. The tool state data acquisition unit 320 may also comprise other sensors capable of detecting a variety of manufacturing variables known to those skilled in the art having benefit of the present disclosure. The tool state data acquisition unit 320 may also comprise a data interface 460. The data interface 460 may receive sensor data from the various sensors that are contained within, or associated with, the processing tool 610 and/or the tool state data acquisition unit 320 and transmit the data to the process controller 310.

Figure 5:
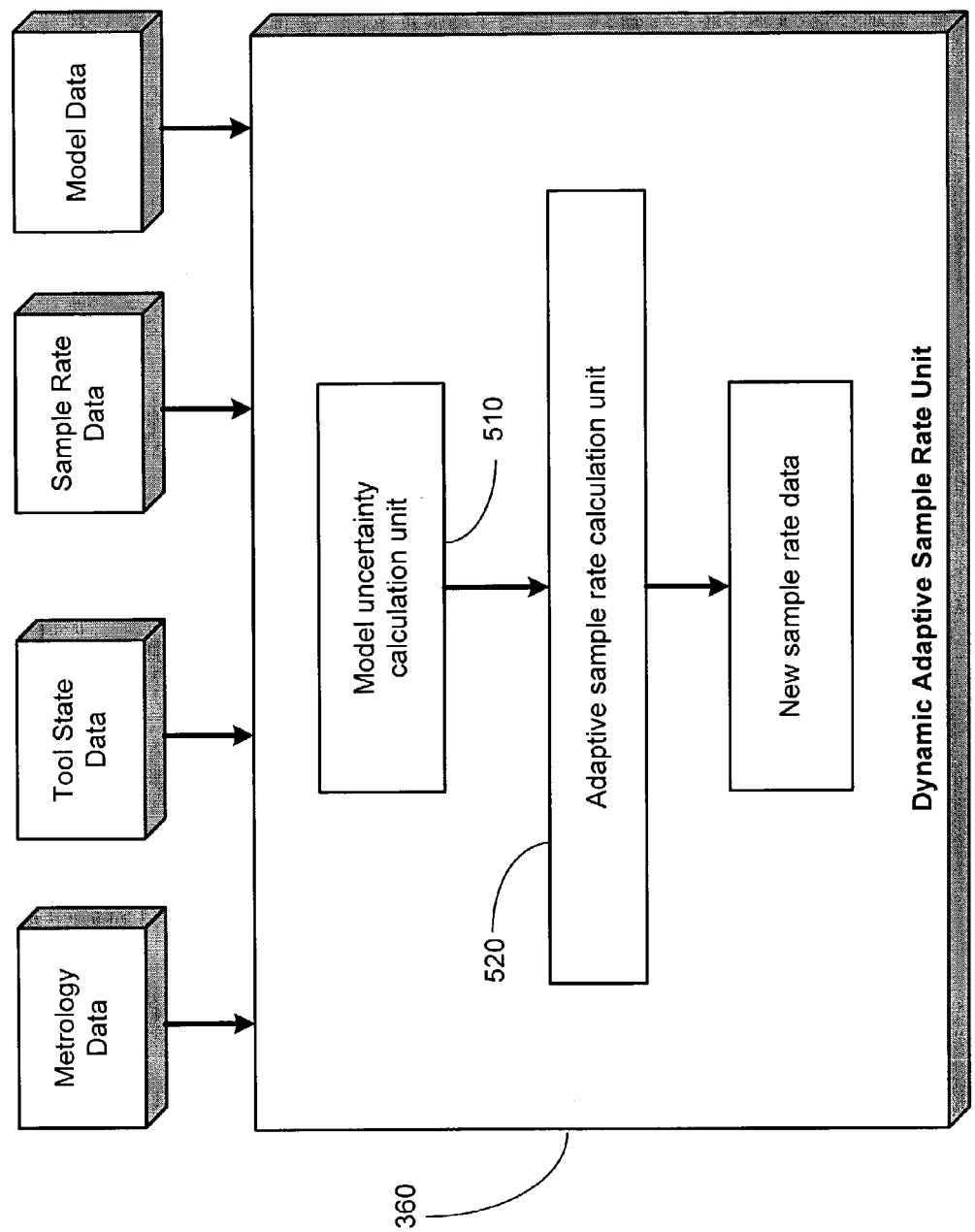
FIG. 5 illustrates a more detailed block diagram representation of a dynamic adaptive sample rate unit of FIG. 3, in accordance with one illustrative embodiment of the present invention.

Turning now to FIG. 5, a more detailed depiction of the dynamic adaptive sample rate unit 360, in accordance with one embodiment of the present invention is provided. The dynamic adaptive sample rate unit 360 may receive a plurality of manufacturing-related data such as metrology data, tool state data, sample rate data, model data from the model unit 350, and the like. Based upon the data received by the dynamic adaptive sampling rate unit 360, a new sample rate may be provided for a more accurate assessment of metrology data. The dynamic adaptive sample rate unit 360 may comprise a model uncertainty calculation unit 510 and an adaptive sample rate calculation unit 520. The model uncertainty calculation unit 510 is capable of determining or quantifying an amount of uncertainty (or certainty) relating to the prediction ability of the model unit 350. In one embodiment, the uncertainty calculation unit 510 may compare prediction data, i.e., the model data, to actual metrology values acquired from metrology data analysis steps and determine an uncertainty in the prediction.

Based upon the calculated uncertainty, the adaptive sample rate calculation unit 520 may increase or decrease the sampling rate at which metrology data is acquired from processed semiconductor wafers 105. If the uncertainty of operation the model unit 350 is high, the sampling rate may be increased so that a more accurate metrology assessment is provided to the model unit 350 to perform a more accurate process output prediction (e.g., more semiconductor wafers 105 in a batch/lot are analyzed). If the model uncertainty is low as calculated by the model uncertainty calculation unit 510, the adaptive sample rate calculation unit 520 may decrease the sampling rate (i.e., lower number of semiconductor wafers 105 in a batch/lot are analyzed).

Adaptively, the dynamic adaptive sample rate unit 360 will adapt and modify the sampling rate up or down to keep the amount of uncertainty in the modeling data output within a predetermined range. By adaptively adjusting the sampling rate, the accuracy of the output of the model unit 350 is increased and kept within a predetermined range of tolerance. Embodiments of the present invention provide for utilizing actual data output and prediction data output to determine a prediction error to drive adaptive changes of the sampling rate at which semiconductor wafers 105 in a batch/lot are analyzed for metrology data acquisition. The dynamic adaptive sample rate unit 360 may provide a new sampling rate based upon the calculations for further analysis of metrology data. In one embodiment, the new sample rate is implemented for examining process semiconductor wafers 105 in a subsequently processed batch.

Figure 6:
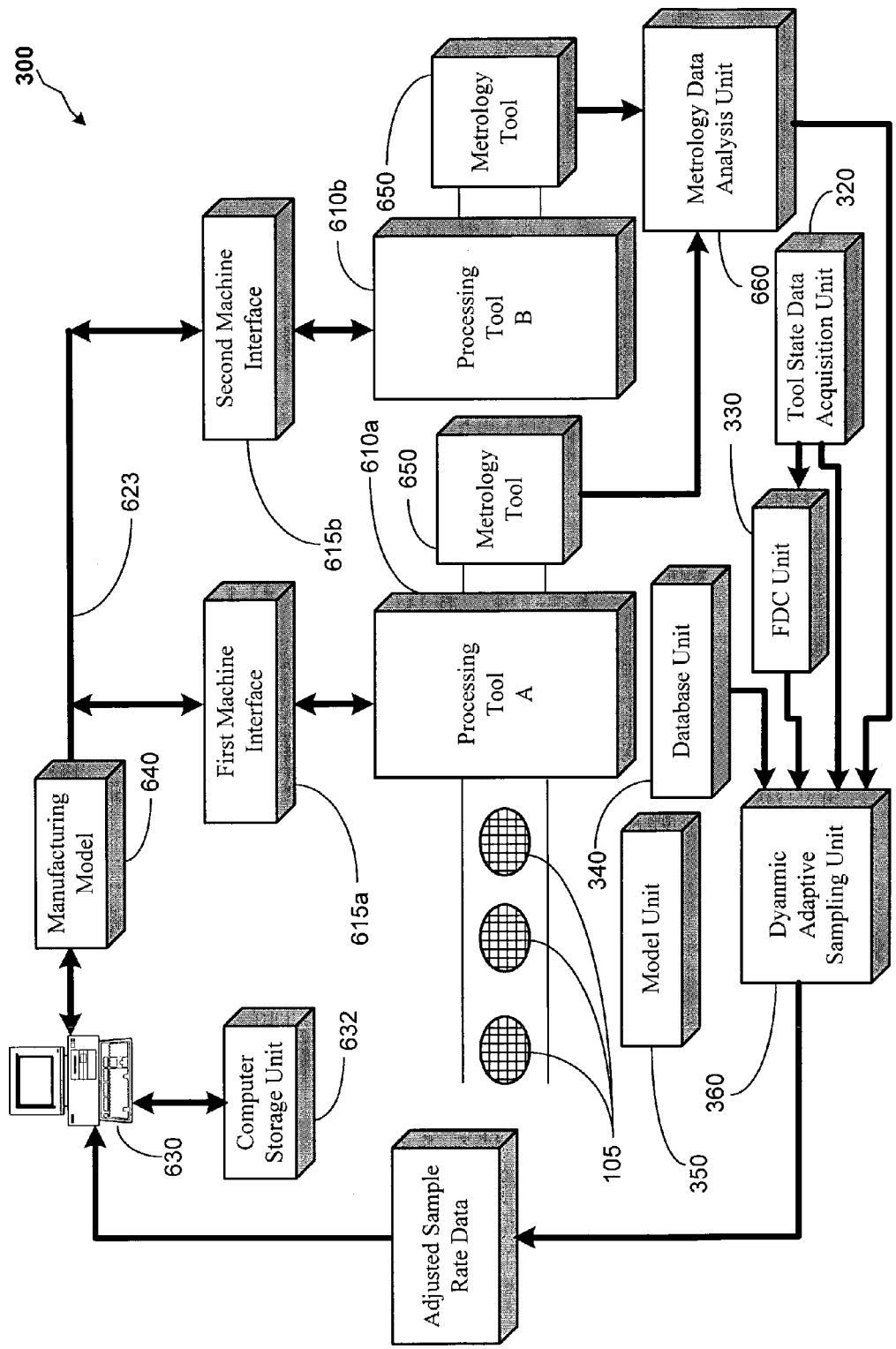
FIG. 6 illustrates a more detailed block diagram representation of the system shown in FIG. 3, in accordance with one illustrative embodiment of the present invention.

Turning now to FIG. 6, a more detailed block diagram of the system 300 in accordance with one embodiment of the present invention is illustrated. Semiconductor wafers 105 are processed on processing tools 610*a*, 610*b* using a plurality of control input signals, or manufacturing parameters, provided via a line or network 623. The control input signals, or manufacturing parameters, on the line 623 are sent to the processing tools 610*a*, 610*b* from a computer system 630 via machine interfaces 615*a*, 615*b*. The first and second machine interfaces 615*a*, 615*b* are generally located outside the processing tools 610*a*, 610*b*. In an alternative embodiment, the first and second machine interfaces 615*a*, 615*b* are located within the processing tools 610*a*, 610*b*. The semiconductor wafers 105 are provided to and carried from a plurality of processing tools 610. In one embodiment, semiconductor wafers 105 may be provided to a processing tool 610 manually. In an alternative embodiment, semiconductor wafers 105 may be provided to a processing tool 610 in an automatic fashion (e.g., robotic movement of semiconductor wafers 105). In one embodiment, a plurality of semiconductor wafers 105 is transported in lots (e.g., stacked in cassettes) to the processing tools 610.

In one embodiment, the computer system 630 sends control input signals, or manufacturing parameters, on the line 623 to the first and second machine interfaces 615*a*, 615*b*. The computer system 630 is capable of controlling processing operations. In one embodiment, the computer system 630 is a process controller. The computer system 630 is coupled to a computer storage unit 632 that may contain a plurality of software programs and data sets. The computer system 630 may contain one or more processors (not shown) that are capable of performing the operations described herein. The computer system 630 employs a manufacturing model 640 to generate control input signals on the line 623. In one embodiment, the manufacturing model 640 contains a manufacturing recipe that determines a plurality of control input parameters that are sent on the line 623 to the processing tools 610*a*, 610*b*.

In one embodiment, the manufacturing model 640 defines a process script and input control that implement a particular manufacturing process. The control input signals (or control input parameters) on the line 623 that are intended for processing tool A 610*a* are received and processed by the first machine interface 615*a*. The control input signals on the line 623 that are intended for processing tool B 610*b* are received and processed by the second machine interface 615*b*. Examples of the processing tools 610*a*, 610*b* used in semiconductor manufacturing processes are steppers, etch process tools, deposition tools, and the like.

One or more of the semiconductor wafers 105 that are processed by the processing tools 610*a*, 610*b* can also be sent to a metrology tool 650 for acquisition of metrology data. The metrology tool 650 may be a scatterometry data acquisition tool, an overlay-error measurement tool, a critical dimension measurement tool, and the like. In one embodiment, a metrology tool 650 examines one or more processed semiconductor wafers 105. The metrology data analysis unit 660 may collect, organize, and analyze data from the metrology tools 650. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 610.

As provided above, the dynamic adaptive sample rate unit 360 receives a plurality of manufacturing related data such as the metrology analysis data from the metrology data analysis unit 660, stored process data from the database unit 340, model prediction data from the model unit 350, tool state data from the tool state data acquisition unit 320, and/or fault detection data from the FDC unit 330. Utilizing the dynamic adaptive process described above, the dynamic adaptive sample rate unit 360 may perform an adjustment upon the sampling rate based upon comparison of end-of-line test results to predicted results. Thereofre, a new sampling rate may be provided to the computer system 630 for use in analysis of a subsequently processed batch/lot of semiconductor wafers 105. The computer system 630 may then implement the new sampling rate such that metrology data analysis is performed on an increased or decreased number of selected semiconductor wafers 105 in a subsequent batch/lot, based upon the new sampling rate.

Figure 7:
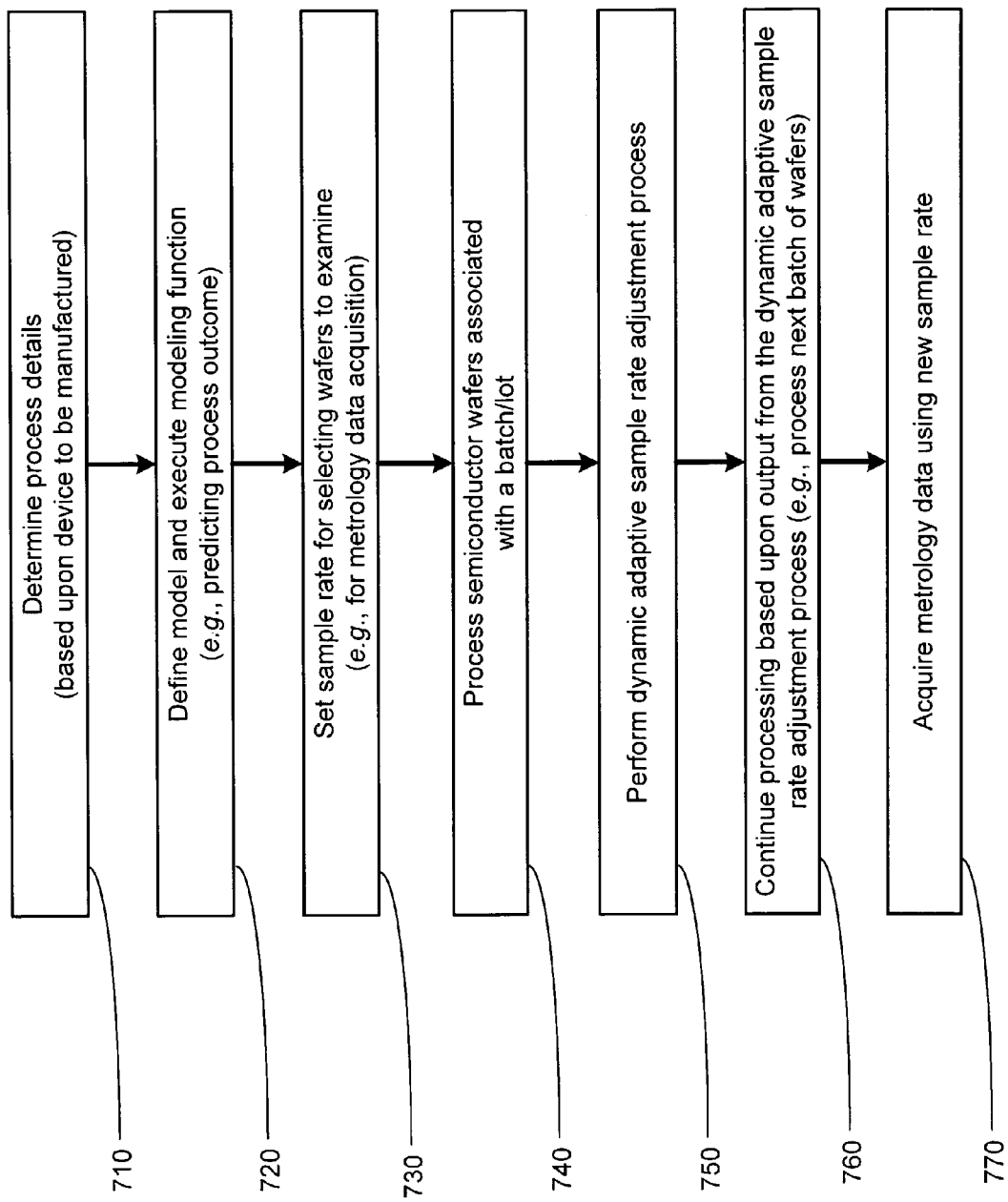
FIG. 7 illustrates a flowchart depiction of a method in accordance with one illustrative embodiment of the present invention.

Turning now to FIG. 7, a flow chart depiction of a method in accordance with embodiments of the present invention is illustrated. Upon preparing to process semiconductor wafers 105, the system 300 may determine process details, e.g., the type of processes to be employed, the order of the processes, and the like (block 710). The process details may generally be based upon the device to be ultimately manufactured from the processed semiconductor wafers 105. The system 300 may then define a model that is capable of controlling and/or predicting a process output based upon a plurality of process input data. Once the model is defined, the modeling function is executed, which may include a process outcome prediction function (block 720). The model may be defined based upon a relationship between process parameters such as process input parameters, and electrical parameters determined from processed semiconductor wafers 105. A more detailed description of defining the process model, as indicated in block 720, is provided in FIG. 8 and accompanying description below.

Based upon the process details and the defined model, the system 300 may set a sample rate to be used for a particular process step (block 730). Generally, the higher the sensitivity of the model, the higher the sampling rate and vice versa. Upon setting the sample rate, the system 300 may process semiconductor wafers 105 associated with a batch/lot (block 740). The system 300 may then acquire metrology data and perform a dynamic adaptive sampling rate adjustment process (block 750). The dynamic adaptive sampling rate adjustment process provides an adjusted new sample rate to be used for acquiring metrology data based upon end-of-line test results that are compared to predicted results. The dynamic adaptive sampling rate adjustment process indicated in block 750 is provided in FIG. 9 and accompanying description below. Based upon the new sampling rate provided as a result of performing the dynamic adaptive sampling rate adjustment process, the system 300 continues processing semiconductor wafers 105 and then acquires metrology data with the new sampling rate (block 760, 770). In one embodiment, the new sampling rate is implemented to examine processed semiconductor wafers 105 in a subsequently processed batch.

Figure 8:
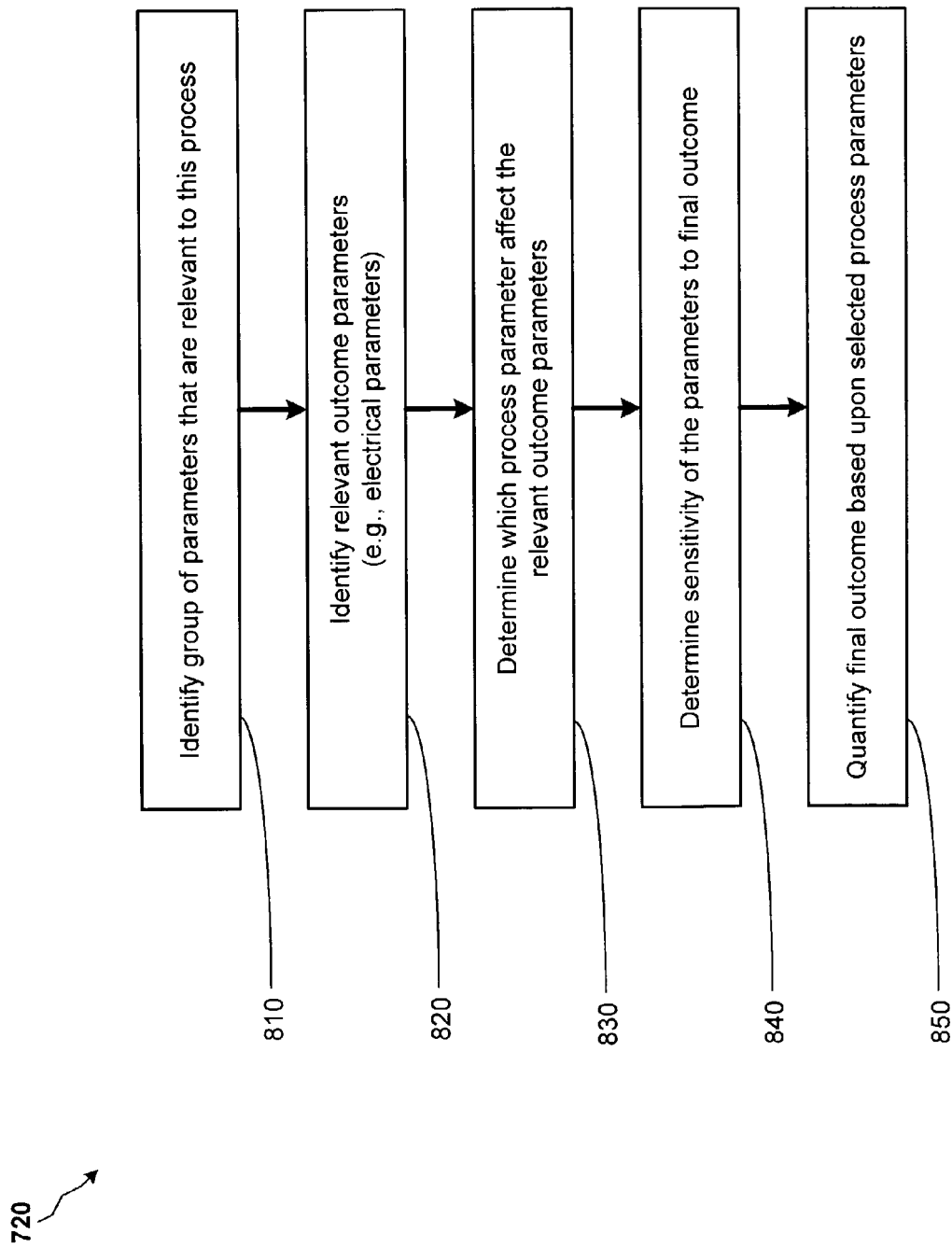
FIG. 8 illustrates a more detailed flowchart depiction of a method of defining a model and executing a modeling function, as indicated in FIG. 7, in accordance with one illustrative embodiment of the present invention.

Turning now to FIG. 8, a more detailed flow chart depiction of the steps involved in defining a model as indicated in block 720 of FIG. 7 is provided. The system 300 may identify a group of parameters that are relevant to a particular process being assessed (block 810). The system 300 then identifies relevant outcome parameters based upon identifying the group of parameters (block 820). For example, outcome parameters in relation to particular electrical parameters are determined. The system 300 then determines which process the parameter(s) affect the relevant outcome parameters (block 830). The system 300 may then determine the sensitivity of the parameters to the final outcome (e.g., sensitivity of the parameters to the final electrical parameters). The sensitivity of the parameters may be determined by analyzing the metrology data, the tool state data, stored process data, and the like (block 840). The system 300 then quantities the final outcome based upon selected process parameters block 850). Generally, this step is performed by predicting the outcome based upon parameters.

Turning now to FIG. 9, a more detailed flow chart depiction of performing the dynamic adaptive sampling rate process is illustrated. The system 300 may predict the model outcome (block 910). In other words, the probable process outcome is predicted by the determined model, such as the model unit 350. The system 300 may acquire actual outcome data (e.g., acquired metrology data and outcome data, such as electrical testing data) (block 920). The system 300 may then prepare actual outcome versus predicted outcome scenarios based upon the parameters (block 930). The comparison of the actual versus predicted process outcome may be used to determine an uncertainty (or certainty) relating to the model. For example, the uncertainty is quantified in the model (e.g., if actual outcome is consistently sufficiently different from the predicted, then the uncertainty is high) (block 940).

The system 300 may then make a determination whether the uncertainty relating to the model prediction is too high for an accurate process operation (block 950). Upon a determination that the uncertainty relating to the model is not too high, the current sample rate is maintained for further processing (block 960). When the system 300 determines that the uncertainty is too high relating to the predicted model outcome, the system 300 performs an adaptation for increasing the sampling rate higher to reduce uncertainty (block 970). The modified sampling rate may be used to examine processed semiconductor wafers 105 associated with a subsequent batch/lot. The steps shown in FIG. 9 substantially complete the steps associated with block 750 of FIG. 7. Utilizing embodiments of the present invention, the system 300 is capable of dynamically adapting to a modified sampling rate based upon a plurality of factors. For example, the system 300 may evaluate the accuracy of the model prediction function and change the sampling rate for more efficient usages of resources.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining a sample rate for acquiring metrology data relating to at least one prediction model relating to performing a process on at least one workpiece of a plurality of workpieces, wherein the at least one prediction model comprises a model adapted to predict at least one possible condition related to performing a process on at least one workpiece of a plurality of workpieces before the at least one possible condition occurs by simulating one or more behaviors of the performed process;
   performing a dynamic sampling rate adjustment process to adaptively modify said sample rate, said dynamic sampling rate adjustment process based upon at least one updated prediction model, and modifying said sampling rate based upon said updated prediction model; and
   acquiring metrology data using the modified sampling rate.

2. The method of claim 1, wherein acquiring metrology data further comprises acquiring metrology data relating to the process performed upon a semiconductor wafer.

3. The method of claim 1, further comprising modeling a process to determine said at least one prediction model.

4. The method of claim 3, wherein performing said dynamic sampling rate adjustment process further comprises:
   acquiring data relating to at least one environmental factor relating to said process to be performed on said workpieces;
   updating the at least one prediction model relating to a process to be performed on said workpieces based upon the at least one environmental factor;
   comparing said at least one updated prediction model with at least one desired outcome;
   determining at least one difference between said at least one updated prediction model and the at least one desired outcome; and
   modifying said sample rate based upon a determination that said difference is above a predetermined range of tolerance.

5. The method of claim 4, wherein acquiring data relating to at least one environmental factor relating to said process performed on said workpieces further comprises acquiring metrology data from at least one processed workpiece.

6. The method of claim 4, wherein determining at least one difference between said at least one updated prediction model and the at least one desired outcome further comprises determining an accuracy associated with the prediction model.

7. The method of claim 4, wherein modifying said sample rate further comprises increasing said sample rate based upon a determination that said difference is not within a predetermined tolerance level.

8. The method of claim 4, wherein modifying said sample rate further comprises decreasing said sample rate based upon a determination that said difference is within a predetermined tolerance level.

9. The method of claim 4, wherein acquiring said data relating to at least one environment factor comprises acquiring data relating to at least one of a temperature data, humidity data, pressure data, electrical data, and gas flow data.

10. The method of claim 3, wherein the at least one prediction model relating to performing a process on said workpieces further comprises predicting at least one electrical test value of a workpiece.

11. The method of claim 3, wherein performing said dynamic sampling rate adjustment process further comprises increasing said sample rate based upon a determination that at least one control parameter is sensitive to said at least one prediction model.

12. A method, comprising:
   determining a sample rate for acquiring metrology data relating to at least one of said processed workpieces;
   determining at least one prediction model relating to performing a process on said workpieces, wherein the at least one prediction model comprises a model adapted to predict at least one possible condition related to performing a process said workpieces before the at least one possible condition occurs by simulating one or more behaviors of the performed process;
   acquiring data relating to at least one environmental factor relating to said process to be performed on said workpieces based upon said sample rate;
   comparing said with the at least one environmental factor;
   determining a difference relating to a desired process outcome based upon the at least one environmental factor; and
   modifying said sample rate based upon a determination that the difference is above a predetermined range of tolerance.

13. The method of claim 12, wherein determining at least one prediction model relating to performing a process on said workpieces further comprises predicting at least one electrical test value of a workpiece.

14. The method of claim 12, wherein acquiring at least one environmental factor relating to said process to be performed on said workpieces further comprises acquiring metrology data from at least one processed workpiece.

15. A computer readable program storage device encoded with instructions that, when executed by a computer, performs a method, comprising:
   determining a sample rate for acquiring metrology data relating to at least one prediction model relating to performing a process on at least one workpiece of a plurality of workpieces, wherein the at least one prediction model comprises a model adapted to predict at least one possible condition related to performing a process on at least one workpiece of a plurality of workpieces before the at least one possible condition occurs by simulating one or more behaviors of the performed process;

performing a dynamic sampling rate adjustment process to adaptively modify said sample rate, said dynamic sampling rate adjustment process based upon at least one updated prediction model and modifying said sampling rate based upon said comparison; and acquiring metrology data using the modified sampling rate.

16. The computer readable program storage device encoded with instructions that, when executed by a computer, performs the method of claim 15, wherein performing a process on at least one workpiece further comprises performing a process upon a semiconductor wafer.

17. The computer readable program storage device encoded with instructions that, when executed by a computer, performs the method of claim 15, further comprising modeling a process to determine at least one prediction model.

18. The computer readable program storage device encoded with instructions that, when executed by a computer, performs the method of claim 17, wherein performing said dynamic sampling rate adjustment process further comprises:

defining the at least one prediction model relating to a process to be performed on said workpieces;

predicting an outcome relating to performing a process on said workpieces;

acquiring environmental data relating to performing the process on said workpieces;

comparing said desired outcome with said at least one prediction model;

determining a difference relating to a desired outcome prediction performed by said model; and modifying said sample rate based upon a determination that the difference is above a predetermined range of tolerance.

19. The computer readable program storage device encoded with instructions that, when executed by a computer, performs the method of claim 18, wherein determining a difference relating to the desired outcome prediction performed by said model further comprises determining an accuracy associated with the prediction.

20. The computer readable program storage device encoded with instructions that, when executed by a computer, performs the method of claim 18, wherein modifying said sample rate further comprises increasing said sample rate based upon a determination that the difference is not within a predetermined tolerance level.

21. The computer readable program storage device encoded with instructions that, when executed by a computer, performs the method of claim 18, wherein modifying said sample rate further comprises decreasing said sample rate based upon a determination that the difference is within a predetermined tolerance level.

22. The computer readable program storage device encoded with instructions that, when executed by a computer, performs the method of claim 17, wherein the at least one prediction model relating to performing a process on at least one workpiece further comprises predicting at least one electrical test value of a workpiece.

23. The computer readable program storage device encoded with instructions that, when executed by a computer, performs the method of claim 17, wherein performing said dynamic sampling rate adjustment process further comprises increasing said sample rate based upon a determination that at least one control parameter is sensitive to said desired outcome.

24. A computer readable program storage device encoded with instructions that, when executed by a computer, performs a method, comprising:

determining a sample rate for acquiring metrology data relating to one prediction model relating to a workpiece, wherein the one prediction model comprises a model adapted to predict at least one possible condition related to performing a process on at least one workpiece before the at least one possible condition occurs by simulating one or more behaviors of the performed process; and performing a dynamic sampling rate adjustment process to adaptively modify said sample rate, said dynamic sampling rate adjustment process comprising comparing the prediction model and at least one pre-processing environmental change and modifying said sampling rate based upon said comparison.

\* \* \* \* \*